United States Patent
Ho et al.

(10) Patent No.: US 7,382,049 B2
(45) Date of Patent: Jun. 3, 2008

(54) CHIP PACKAGE AND BUMP CONNECTING STRUCTURE THEREOF

(75) Inventors: Kwun-Yao Ho, Hsin-Tien (TW); Moriss Kung, Hsin-Tien (TW)

(73) Assignee: VIA Technologies, Inc., Taipei Hsien (TW)

( * ) Notice: Subject to any disclaimer, the term of this patent is extended or adjusted under 35 U.S.C. 154(b) by 275 days.

(21) Appl. No.: 11/313,435

(22) Filed: Dec. 19, 2005

(65) Prior Publication Data
US 2007/0045869 A1 Mar. 1, 2007

(30) Foreign Application Priority Data
Aug. 30, 2005 (TW) ............... 94129621 A

(51) Int. Cl.
*H01L 23/48* (2006.01)
*H01L 23/52* (2006.01)

(52) U.S. Cl. ............... 257/737; 257/750; 257/778; 257/E23.021

(58) Field of Classification Search ............... 257/737, 257/750, 778, E23.021
See application file for complete search history.

(56) References Cited

U.S. PATENT DOCUMENTS

| 5,466,635 A * | 11/1995 | Lynch et al. ............... 438/614 |
| 5,912,505 A * | 6/1999 | Itoh et al. ............... 257/737 |
| 6,229,220 B1 | 5/2001 | Saitoh et al. ............... 257/780 |
| 6,251,581 B1 * | 6/2001 | Ullman et al. ............... 435/4 |
| 6,335,571 B1 * | 1/2002 | Capote et al. ............... 257/787 |
| 6,433,426 B1 * | 8/2002 | Ikegami ............... 257/737 |
| 2002/0113312 A1 * | 8/2002 | Clatanoff et al. ............... 257/737 |
| 2002/0121706 A1 * | 9/2002 | Tatsuta et al. ............... 257/778 |

* cited by examiner

*Primary Examiner*—Nitin Parekh
(74) *Attorney, Agent, or Firm*—J.C. Patents

(57) ABSTRACT

A chip package includes a chip, a carrier, and at least a bump connecting structure for connecting the chip to the carrier. The bump connecting structure includes a first metal bump disposed on a chip pad of the chip and has a first height relative to a passivation layer of the chip, a second metal bump disposed on a carrier pad of the carrier and has a second height relative to a solder mask layer of the carrier, and a middle metal part disposed between the first and the second metal bumps. The sum of the minimum distance between the first and the second metal bumps, the first height of the first metal bump, and the second height of the second metal bump is less than 60 micrometers. The melting point of the middle metal part is lower than that of the first and the second metal bumps.

26 Claims, 3 Drawing Sheets

CHIP PACKAGE AND BUMP CONNECTING STRUCTURE THEREOF

CROSS-REFERENCE TO RELATED APPLICATION

This application claims the priority benefit of Taiwan application serial no. 94129621, filed on Aug. 30, 2005. All disclosure of the Taiwan application is incorporated herein by reference.

BACKGROUND OF THE INVENTION

1. Field of Invention

The present invention relates to a semiconductor device and a connecting structure thereof. More particularly, the present invention relates to a chip package and a bump connecting structure thereof.

2. Description of Related Art

In the semiconductor industry, the production of integrated circuits (IC) is mainly divided into three phases: IC design, IC process, and IC package. In IC process, the chip is manufactured through wafer making, integrated circuit making, and wafer dicing etc. procedures. A wafer has an active surface, which refers generally to the surface on which the wafer has an active device. When the integrated circuit on the wafer has been made, the integrated circuit has a plurality of chip pads located on the active surface of the wafer. The chip eventually formed after wafer dicing may be electrically connected externally to a carrier through the chip pads. The carrier is, for example, a leadframe or a package substrate, and the chip may be connected to the carrier through wire bonding or flip chip bonding, so that the chip pads of the chip may be electrically connected to the contacts of the carrier.

In the flip chip bonding technology, after forming chip pads on the active surface of a wafer, bumps are formed on the chip pads respectively for electrically connecting the chip with the package substrate. Since these bumps are generally arranged on the active surface of the chip in area array, the flip chip bonding technology is suitable for chip packages with high contact number and high contact density, such that it has been widely used in the flip chip/ball grid array packages in the semiconductor industry. Moreover, compared with the wire bonding technology, the flip chip bonding technology may improve the electrical performance of the chip package because these bumps may provide shorter transmission paths between the chip and the carrier.

FIG. 1 is a cross-section view of a conventional flip chip package. Referring to FIG. 1, the conventional flip chip package 100 includes a chip 110, a substrate 120, a plurality of solder bumps 130, a plurality of under bump metallurgy (UBM) layers 140, and an underfill 150. The chip 110 has an active surface 112 and a plurality of chip pads 114 disposed on the active surface 112. In addition, the chip 110 further has a passivation layer 116 including a sub-passivation layer 116a and a stress buffer layer (SBL) 116b. The sub-passivation layer 116a and the stress buffer layer 116b overlay the active surface 112 to protect the chip 110 and expose each chip pad 114.

The UBM layers 140 are located between the chip pads 114 and the solder bumps 130 respectively. Each UBM layer 140 may include an adhesion layer, a barrier layer, and a wetting layer formed on the chip pad 114 sequentially. The UBM layers 140 are used for increasing the connecting strength between the solder bumps 130 and the chip pads 114, and for preventing the electro-migration.

The substrate 120 has a substrate surface 122, a plurality of bump pads 124, and a solder mask layer 126. The bump pads 124 are disposed on the substrate surface 122, and the solder mask layer 126 is disposed on the substrate surface 122 and exposes the bump pads 124. Each chip pad 114 is electrically connected to a corresponding bump pad 124 through one of the solder bumps 130. The material of the solder bumps 130 is, for example, lead solder or lead free solder.

The underfill 150 is located between the chip 110 and the substrate 120, and contains the solder bumps 130. The underfill 150 is used for protecting the solder bumps 130, and at the same time may reduce the thermal strain mismatch between the substrate 120 and the chip 110 when they are heated.

However, after the aforementioned flip chip package 100 has been used for a long time, cracks may appear on the side of the solder bumps 130 (especially solder bumps of lead-free solder) close to the chip pads 114, that results in the decrease of the reliability of the flip chip package 100. In addition, cracks may also appear on the side of the solder bumps 130 (especially solder bumps of lead-free solder) close to the bump pads 124, that results in the decrease of the reliability of the flip chip package 100.

SUMMARY OF THE INVENTION

The present invention provides a chip package including a chip, a carrier, and at least a bump connecting structure. The chip has an active surface, at least a chip pad disposed on the active surface, and a passivation layer disposed on the active surface and exposing the chip pad. In addition, the carrier has a carrier surface, at least a carrier pad disposed on the carrier surface, and a solder mask layer disposed on the carrier surface and exposing the carrier pad. Furthermore, the chip and the carrier are electrically connected through the bump connecting structure, which includes a first metal bump, a second metal bump, and a middle metal part. The first metal bump is disposed on the chip pad and has a first height relative to the surface of the passivation layer. The second metal bump is disposed on the carrier pad and has a second height relative to the surface of the solder mask layer. The middle metal part is disposed between the first metal bump and the second metal bump, wherein the sum of the minimum distance between the first metal bump and the second metal bump, the first height of the first metal bump, and the second height of the second metal bump is less than 60 micrometers, and the melting point of the middle metal part is lower than that of the first metal bump and the second metal bump.

The present invention further provides a bump connecting structure for electrically connecting a chip and a carrier, wherein the chip has at least a chip pad and a passivation layer exposing the chip pad, and the carrier has at least a carrier pad and a solder mask layer exposing the carrier pad. The bump connecting structure includes a first metal bump, a second metal bump, and a middle metal part. The first metal bump is disposed on the chip pad and has a first height relative to the surface of the passivation layer. The second metal bump is disposed on the carrier pad and has a second height relative to the surface of the solder mask layer. The middle metal part is disposed between the first metal bump and the second metal bump, wherein the sum of the minimum distance between the first metal bump and the second metal bump, the first height of the first metal bump, and the second height of the second metal bump is less than 60 micrometers, and the melting point of the middle metal part is lower than that of the first metal bump and the second metal bump.

In order to make the features and advantages of the present invention comprehensible, an embodiment accompanied with figures is described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 2:
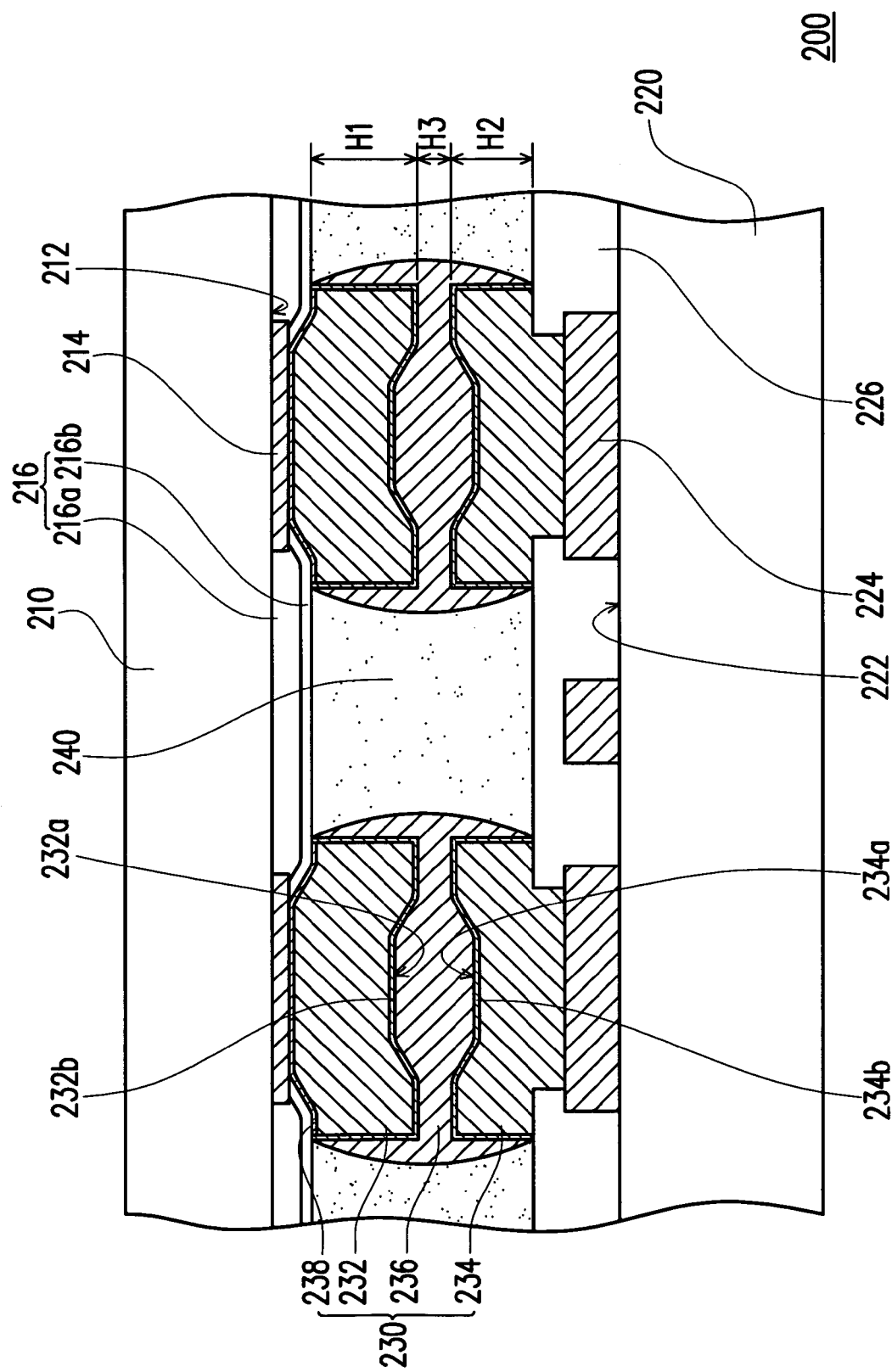
FIG. 2 is a cross-section view of a chip package according to an embodiment of the present invention.

Referring to FIG. 2, which is a cross-section view of a chip package according to an embodiment of the present invention. The chip package 200 of the present embodiment includes a chip 210, a carrier 220, and a plurality of bump connecting structures 230, wherein the chip 210 is electrically connected to the carrier 220 through the bump connecting structures 230. In the present embodiment, the chip package 200 is, for example, a flip chip package, and the carrier 200 is, for example, a package substrate. The chip 210 has an active surface 212, a plurality of chip pads 214 disposed on the active surface 212, and a passivation layer 216 disposed on the active surface 212 and exposing the chip pads 214. In the present embodiment, the passivation layer 216 includes a sub-passivation layer 216a, and a stress buffer layer 216b disposed on the sub-passivation layer 216a. The material of the stress buffer layer 216b is, for example, BenzoCycloButene (BCB) or polyimide (PI). In addition, the carrier 220 has a carrier surface 222, a plurality of carrier pads 224 disposed on the carrier surface 222, and a solder mask layer 226 disposed on the carrier surface 222 and exposing the carrier pads 224.

Each bump connecting structure 230 includes a first metal bump 232, a second metal bump 234, and a middle metal part 236. The first metal bump 232 is disposed on a corresponding chip pad 214, and has a first height H1 relative to the surface of the passivation layer 216. In addition, the second metal bump 234 is disposed on a corresponding carrier pad 224, and has a second height H2 relative to the surface of the solder mask layer 226. Moreover, the middle metal part 236 is disposed between the first metal bump 232 and the second metal bump 234, wherein the sum of the minimum distance H3 between the first metal bump 232 and the second metal bump 234, the first height H1 of the first metal bump 232, and the second height H2 of the second metal bump 234 is less than 60 micrometers, and the melting point of the middle metal part 236 is lower than that of the first metal bump 232 and the second metal bump 234.

As to the sizes, the first height Hi of the first metal bump 232 is, for example, more than or equal to 5 micrometers and less than or equal to 25 micrometers, and the second height H2 of the second metal bump 234 is, for example, more than or equal to 5 micrometers and less than or equal to 25 micrometers. In addition, the minimum distance H3 between the first metal bump 232 and the second metal bump 234 is, for example, more than or equal to 1 micrometer. It is preferred that the minimum distance H3 is more than or equal to 5 micrometers. In other words, the ratio of the first height H1 to the second height H2 is between 0.2 and 5, denoted as $0.2 \leq H1/H2 \leq 5$. Moreover, since the sum of the first height H1, the second height H2, and the minimum distance H3 is less than 60 micrometers, the minimum distance H3 is less than 50 micrometers.

As to physical characteristics, the difference between the melting point of the first metal bump 232 and the melting point of the middle metal part 236 is, for example, more than or equal to 50° C., and the difference between the melting point of the second metal bump 234 and the melting point of the middle metal part 236 is, for example, more than or equal to 50° C. As to the material, the material of the first metal bump 232 may include copper, nickel, or gold, the material of the second metal bump 234 may include copper, nickel, or gold, and the material of the middle metal part 236 may includes solder.

To melt the middle metal part 236 in a reflow process to connect the first metal bump 232 and the second metal bump 234, the melting point of the middle metal part 236 is set to be lower than that of the first metal bump 232 and the second metal bump 234. Accordingly, during the process of melting the middle metal part 236, the first metal bump 232 and the second metal bump 234 will not be molten with the middle metal part 236.

Figure 3:
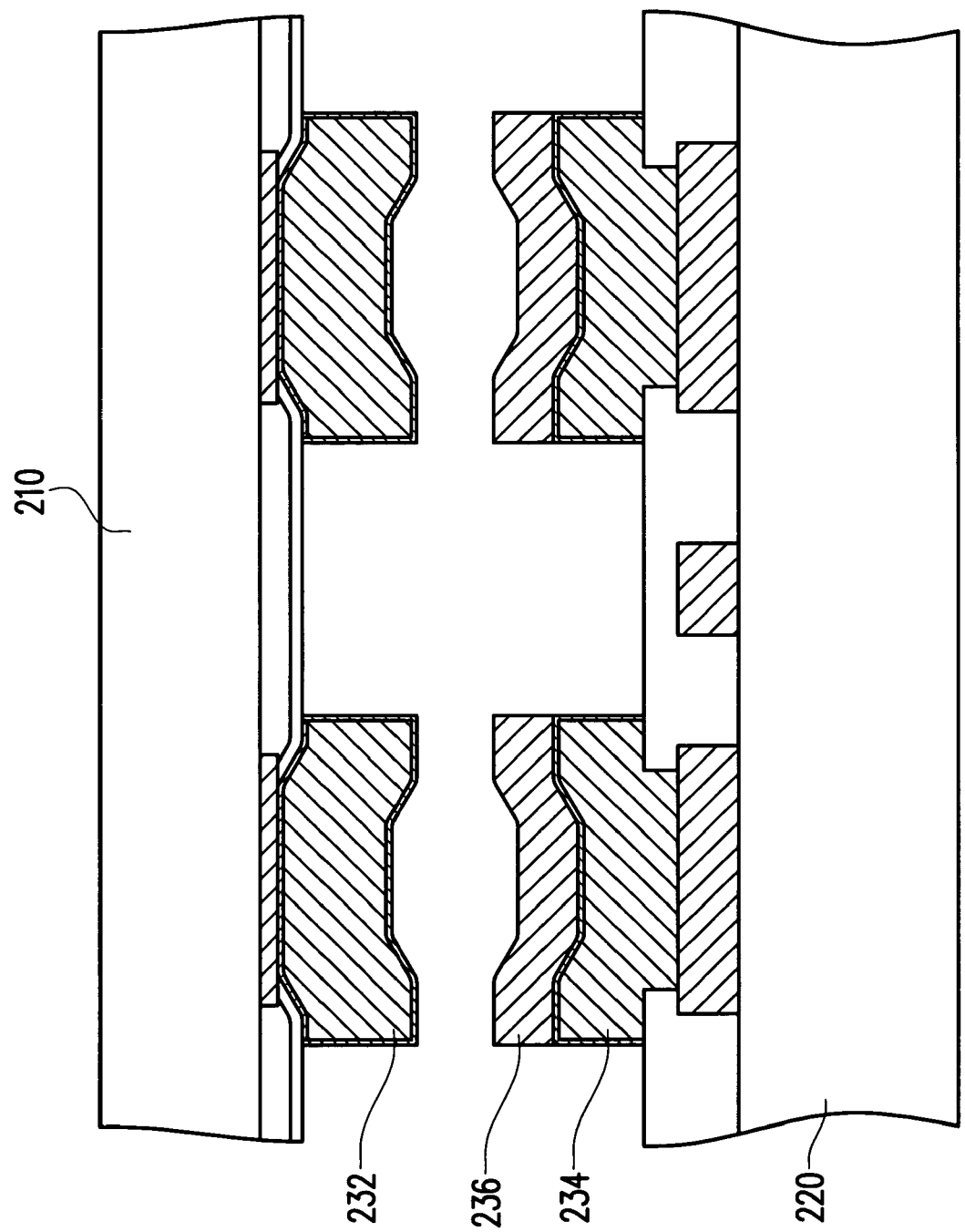
FIG. 3 is a cross-section view of the chip and the carrier in FIG. 2 before they are connected.

FIG. 3 is a cross-section view of the chip and the carrier in FIG. 2 before they are connected. Referring to FIG. 2 and 3, in order to connect the first metal bump 232 to the second metal bump 234, the middle metal part 236 is formed on the surface of the second metal bump 234 first, as shown in FIG. 3. After raising the temperature to melt the middle metal part 236, the liquid middle metal part 236 on the surface of the solid second metal bump 234 is in touch with the surface of the solid first metal bump 232 such that the first metal bump 232 connects the second metal bump 234 through the middle metal part 236. Finally, the liquid middle metal part 236 is cooled and solidified, as shown in FIG. 2. However, in another embodiment, the middle metal part 236 may be formed in advance on the surface of the first metal bump 232, and the first metal bump 232 and the second metal bump 234 are connected through the middle metal part 236, but this is not described in the figures.

Referring to FIG. 2 again, as to the appearance, the first metal bump 232 may have a pit 232a facing the second metal bump 234, and the second metal bump 234 may also have a pit 234a facing the first metal bump 232 when the first metal bump 232 and the second metal bump 234 are formed respectively on the chip pad 214 and the carrier pad 224 in a plating process. In other words, the pit 232a of the first metal bump 232 and the pit 234a of the second metal bump 234 face each other. It should be noted that a space for accommodating a portion of the middle metal part 236 may be formed between the pit 232a and the pit 234a, and the pit 232a and the pit 234a may further increase the surface areas of the first metal bump 232 and the second metal bump 234 respectively.

Figure 1:
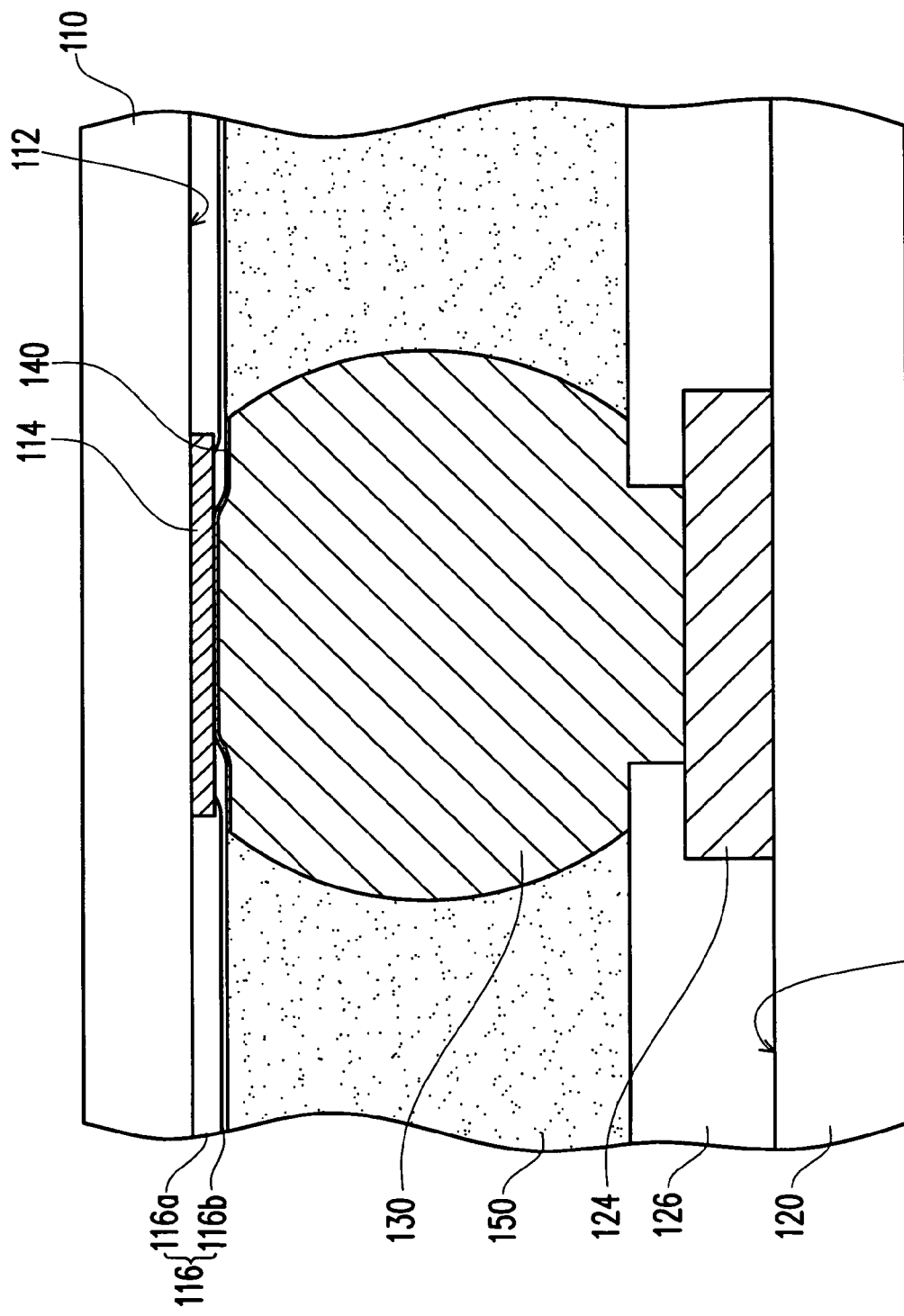
FIG. 1 is a cross-section view of a conventional flip chip package.

Each bump connecting structure 230 may further include an interface metal layer 238 located between a corresponding chip pad 214 and the first metal bump 232. The function of the interface metal layer 238 is similar to the UBM layer 140 of the conventional flip chip package in FIG. 1.

The first metal bump 232 may further include a first thin film 232b, which is located at the interface between the first metal bump 232 and the middle metal part 236, and used for improving the adhesion between the first metal bump 232 and the middle metal part 236. The material of the first thin film 232b includes, for example, organic material or gold. In addition, the second metal bump 234 may also include a second thin film 234b, which is located at the interface between the second metal bump 234 and the middle metal part 236, and used for improving the adhesion between the second metal bump 234 and the middle metal part 236. The material of the second thin film 234b includes, for example, organic material or gold. The thin film 234a or 234b may vaporize or dissolve into the middle metal part 236 after a bonding process.

The chip package 200 of the present embodiment further includes a underfill 240 located between the chip 210 and the carrier 220, and the underfill 240 surrounds the bump connecting structures 230 to protect the bump connecting structures 230 and used for reducing the thermal strain mismatch between the carrier 220 and the chip 210 while the chip 210 generates high temperature during operation.

In overview, the bump connecting structure of the present invention has at least the following advantages:
a) Since the connecting area between the first metal bump and the middle metal part, and the connecting area between the second metal bump and the middle metal part are larger, these two connecting areas have higher connecting strength. Accordingly, the bump connecting structure of the present invention has higher reliability;
b) The vertical extensions of the first metal bump and the second metal bump may reduce the horizontal areas of the chip pad and of the carrier pad relatively. Accordingly, the layout density of the chip and the layout density of the carrier may be further increased;
c) Since the height of the bump connecting structure is less than 60 micrometers, the thickness of the chip package may be reduced;
d) The middle metal part needs only one reflow process when the material thereof is solder. Accordingly, the time for processing the bump connecting structure and the time for connecting the chip and the carrier may be reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A chip package, comprising:
a chip having an active surface, at least a chip pad disposed on the active surface, and a passivation layer disposed on the active surface and exposing the chip pad;
a carrier having a carrier surface, at least a carrier pad disposed on the carrier surface, and a solder mask layer disposed on the carrier surface and exposing the carrier pad; and
at least a bump connecting structure, wherein the chip and the carrier are electrically connected through the bump connecting structure, comprising:
a first metal bump disposed on the chip pad and having a first height relative to a surface of the passivation layer;
a second metal bump disposed on the carrier pad and having a second height relative to a surface of the solder mask layer, wherein the first metal bump has a first pit facing the second metal bump and the second metal bump has a second pit facing the first metal bump; and
a middle metal part disposed between the first metal bump and the second metal bump, wherein the melting point of the middle metal part is lower than that of the first metal bump and the second metal bump.

2. The chip package as claimed in claim 1, wherein the first height of the first metal bump is more than or equal to 5 micrometers, and less than or equal to 25 micrometers.

3. The chip package as claimed in claim 1, wherein the second height of the second metal bump is more than or equal to 5 micrometers, and less than or equal to 25 micrometers.

4. The chip package as claimed in claim 1, wherein a minimum distance between the first metal bump and the second metal bump is more than or equal to 1 micrometer.

5. The chip package as claimed in claim 1, wherein a difference between the melting point of the first metal bump and the melting point of the middle metal part is more than or equal to 50° C.

6. The chip package as claimed in claim 1, wherein a difference between the melting point of the second metal bump and the melting point of the middle metal part is more than or equal to 50° C.

7. The chip package as claimed in claim 1, further comprising an underfill located between the chip and the carrier and surrounding the bump connecting structure.

8. The chip package as claimed in claim 1, wherein the first metal bump further comprises a first thin film located at an interface between the first metal bump and the middle metal part, and a material of the first thin film comprises organic material or gold.

9. The chip package as claimed in claim 1, wherein the second metal bump further comprises a second thin film located at an interface between the second metal bump and the middle metal part, and a material of the second thin film comprises organic material or gold.

10. The chip package as claimed in claim 1, wherein a material of the first metal bump comprises copper, nickel, or gold, and a material of the second metal bump comprises copper, nickel, or gold.

11. The chip package as claimed in claim 1, wherein a material of the middle metal part comprises solder.

12. Then chip package as claimed in claim 1, wherein the first metal bump and the second metal bump are plating bumps and respectively cover a portion of the passivation layer and the solder mask layer to form the first pit and the second pit.

13. The chip package as claimed in claim 1, wherein a sum of a minimum distance between the first metal bump and the second metal bump, the first height of the first metal bump, and the second height of the second metal bump is less than 60 micrometers.

14. A bump connecting structure used for electrically connecting a chip and a carrier, wherein the chip has at least a chip pad and a passivation layer exposing the chip pad, the carrier has at least a carrier pad and a solder mask layer exposing the carrier pad, the bump connecting structure comprising:
a first metal bump disposed on the chip pad and having a first height relative to a surface of the passivation layer;
a second metal bump disposed on the carrier pad and having a second height relative to a surface of the solder mask layer, wherein the first metal bump has a first pit facing the second metal bump and the second metal bump has a second pit facing the first metal bump; and a middle metal part disposed between the first metal bump and the second metal bump, wherein the melting point of the middle metal part is lower than that of the first metal bump and the second metal bump.

15. The bump connecting structure as claimed in claim 14, wherein the first height of the first metal bump is more than or equal to 5 micrometers, and less than or equal to 25 micrometers.

16. The bump connecting structure as claimed in claim 14, wherein the second height of the second metal bump is more than or equal to 5 micrometers, and less than or equal to 25 micrometers.

17. The bump connecting structure as claimed in claim 14, wherein a minimum distance between the first metal bump and the second metal bump is more than or equal to 1 micrometer.

18. The bump connecting structure as claimed in claim 14, wherein a difference between the melting point of the first metal bump and the melting point of the middle metal part is more than or equal to 50° C.

19. The bump connecting structure as claimed in claim 14, wherein a difference between the melting point of the second metal bump and the melting point of the middle metal part is more than or equal to 50° C.

20. The bump connecting structure as claimed in claim 14, further comprising an interface metal layer located between the chip pad and the first metal bump.

21. The bump connecting structure as claimed in claim 14, wherein the first metal bump further comprises a first thin film located at an interface between the first metal bump and the middle metal part, and a material of the first thin film comprises organic material or gold.

22. The bump connecting structure as claimed in claim 14, wherein the second metal bump further comprises a second thin film located on a surface of the second metal bump connecting the middle metal part, and a material of the second thin film comprises organic material or gold.

23. The bump connecting structure as claimed in claim 14, wherein a material of the first metal bump comprises copper, nickel, or gold, and a material of the second metal bump comprises copper, nickel, or gold.

24. The bump connecting structure as claimed in claim 14, wherein a material of the middle metal part comprises solder.

25. The bump connecting structure as claimed in claim 14, wherein the first metal bump and the second metal bump are plating bumps and respectively cover a portion of the passivation layer and the solder mask layer to form the first pit and the second pit.

26. The bump connecting structure as claimed in claim 14, wherein a sum of a minimum distance between the first metal bump and the second metal bump, the first height of the first metal bump, and the second height of the second metal bump is less than 60 micrometers.

* * * * *